United States Patent
Lu et al.

(10) Patent No.: US 7,243,324 B2
(45) Date of Patent: Jul. 10, 2007

(54) METHOD OF BUFFER INSERTION TO ACHIEVE PIN SPECIFIC DELAYS

(75) Inventors: Aiguo Lu, Pleasanton, CA (US); Ivan Pavisic, San Jose, CA (US); Nikola Radovanovic, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 194 days.

(21) Appl. No.: 11/041,489

(22) Filed: Jan. 24, 2005

(65) Prior Publication Data

US 2006/0190901 A1 Aug. 24, 2006

(51) Int. Cl.
*G06F 17/50* (2006.01)
*G06F 9/45* (2006.01)

(52) U.S. Cl. .............................. 716/6; 716/2
(58) Field of Classification Search .............. 716/1, 716/5–6, 2
See application file for complete search history.

(56) References Cited

U.S. PATENT DOCUMENTS

| | | | |
|---|---|---|---|
| 6,487,697 B1 | 11/2002 | Lu et al. | |
| 6,564,361 B1 | 5/2003 | Zolotykh et al. | |
| 2004/0064793 A1* | 4/2004 | Alpert et al. | 716/2 |
| 2006/0010414 A1* | 1/2006 | Lee et al. | 716/10 |

* cited by examiner

*Primary Examiner*—Paul Dinh
*Assistant Examiner*—Suresh Memula
(74) *Attorney, Agent, or Firm*—Eric James Whitesell

(57) ABSTRACT

A method of buffer insertion for a tree network in an integrated circuit design includes steps of: (a) receiving as input an integrated circuit design including a tree network; (b) selecting a buffer type available to the integrated circuit design from a cell library that results in a minimum total delay for a predetermined wire length; (c) identifying each candidate leaf node in the tree network that has a required pin-specific target delay; (d) inserting a buffer between each internal node that is traversed by a path from a candidate leaf node to a root node of the tree network and each leaf node that is not a candidate leaf node; (e) creating a buffer sub-tree in the tree network from an upstream internal node for each internal node that is traversed by a path from a candidate leaf node to a root node of the tree network; re-parenting each internal node that is traversed by a path from a candidate leaf node to a root node of the tree network to a new buffer in the buffer sub-tree; and (g) generating as output a revised integrated circuit design that includes the buffer sub-tree.

18 Claims, 8 Drawing Sheets

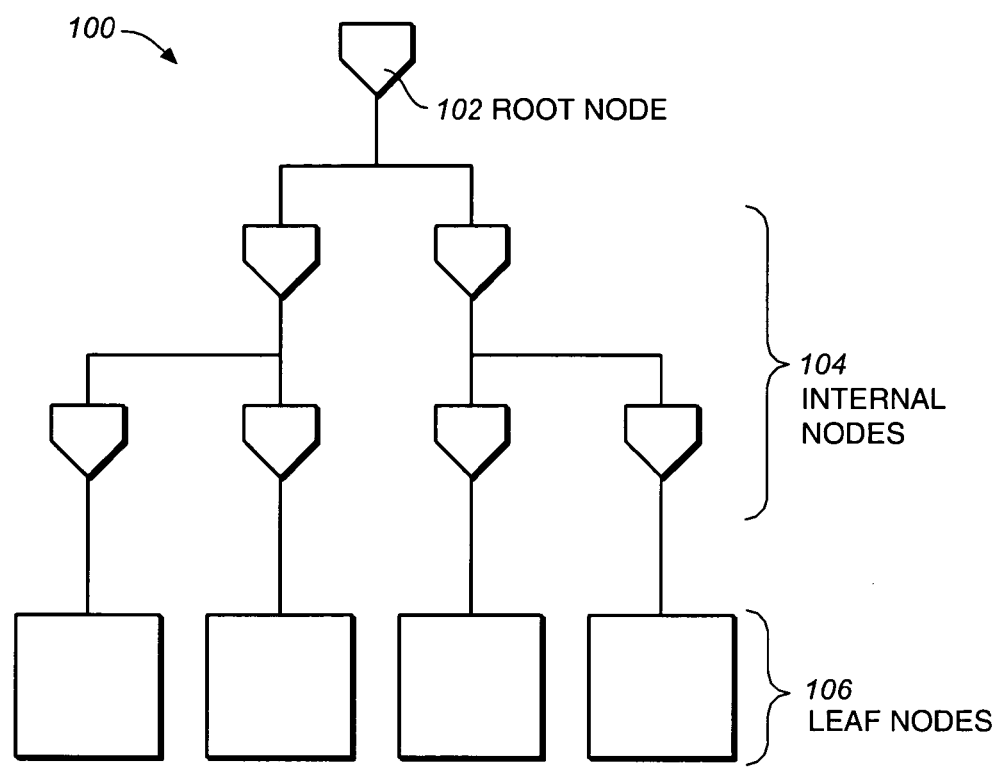
FIG._1
(PRIOR ART)

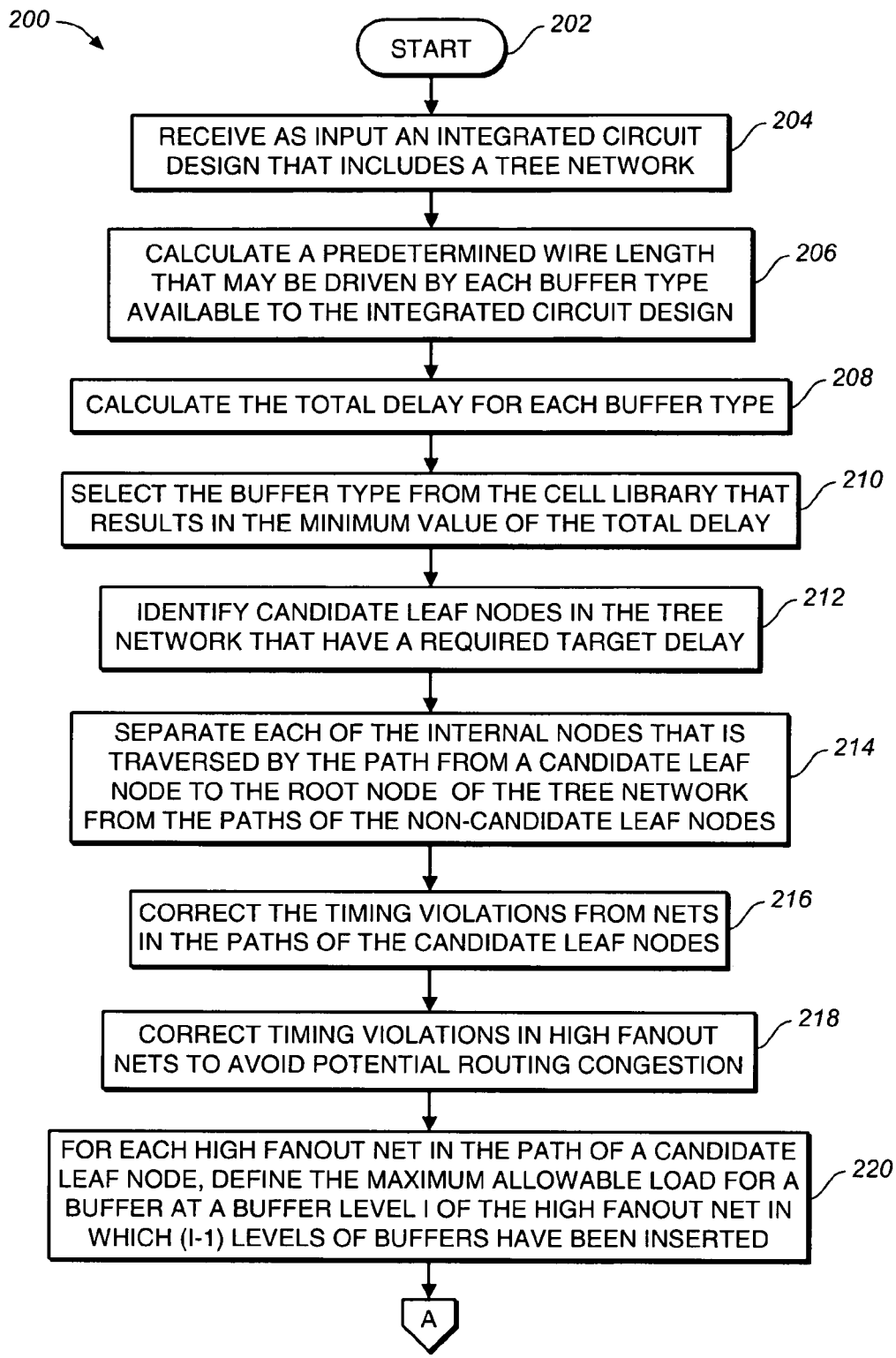
FIG._ 2A

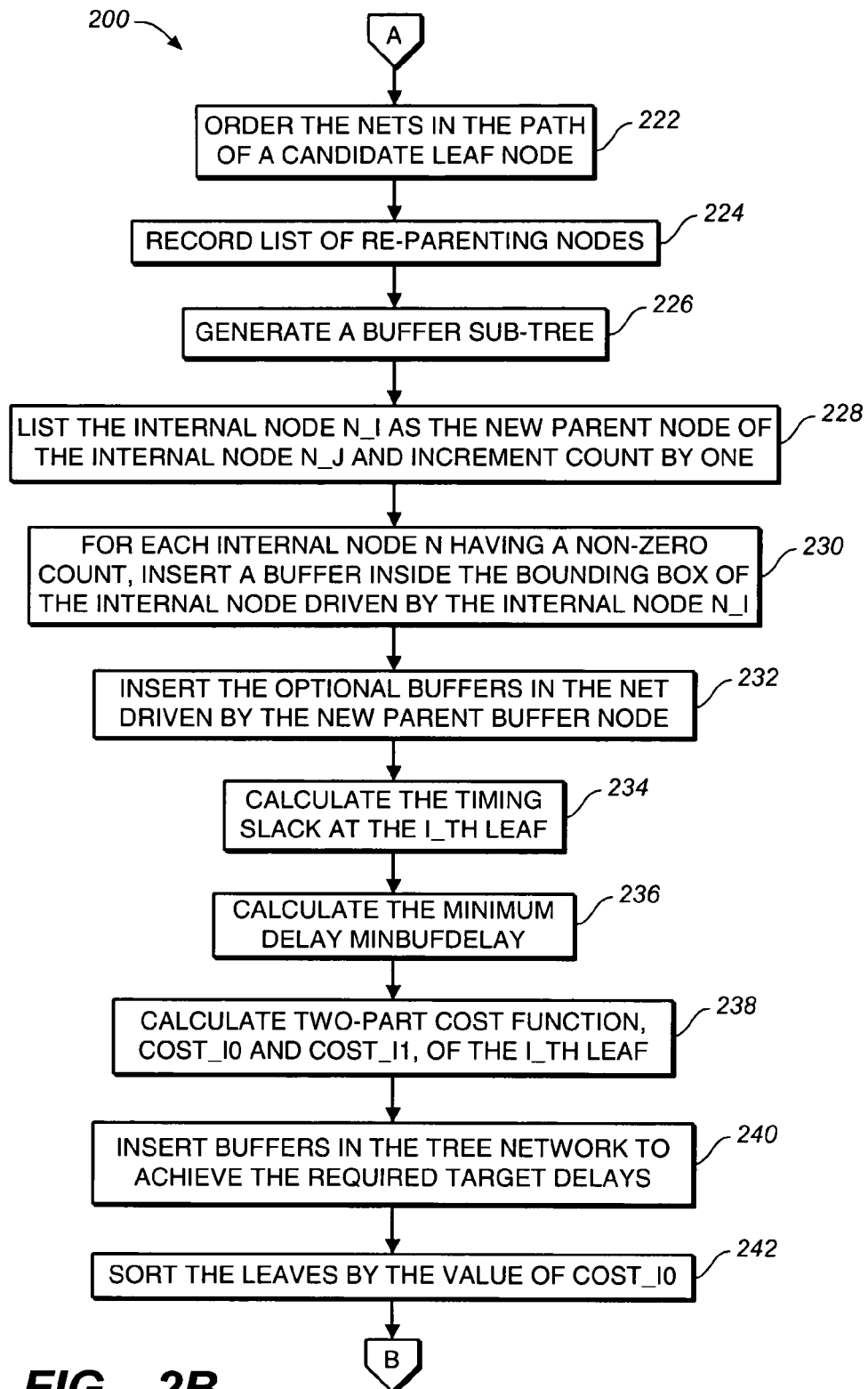
FIG._2B

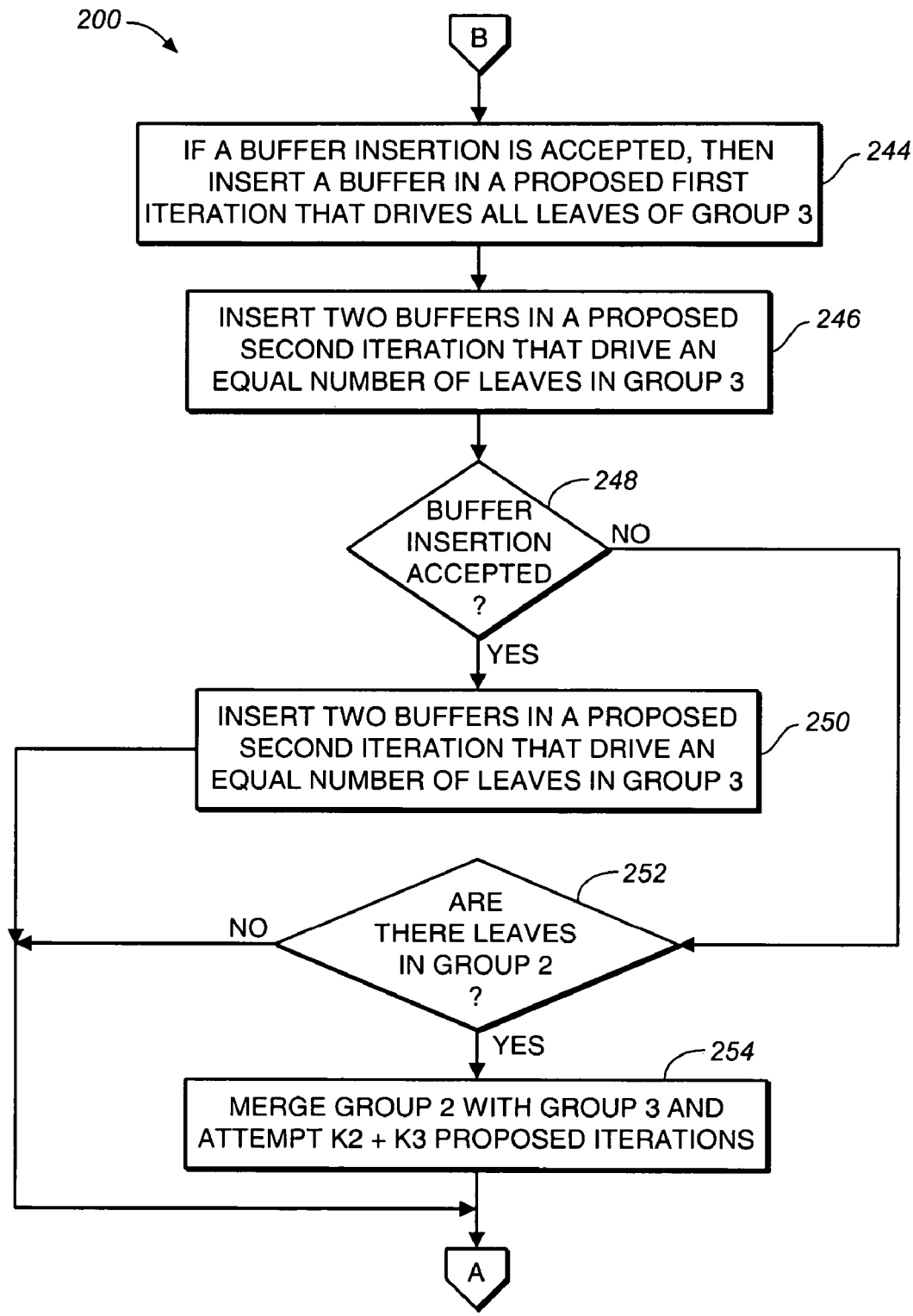
FIG._ 2C

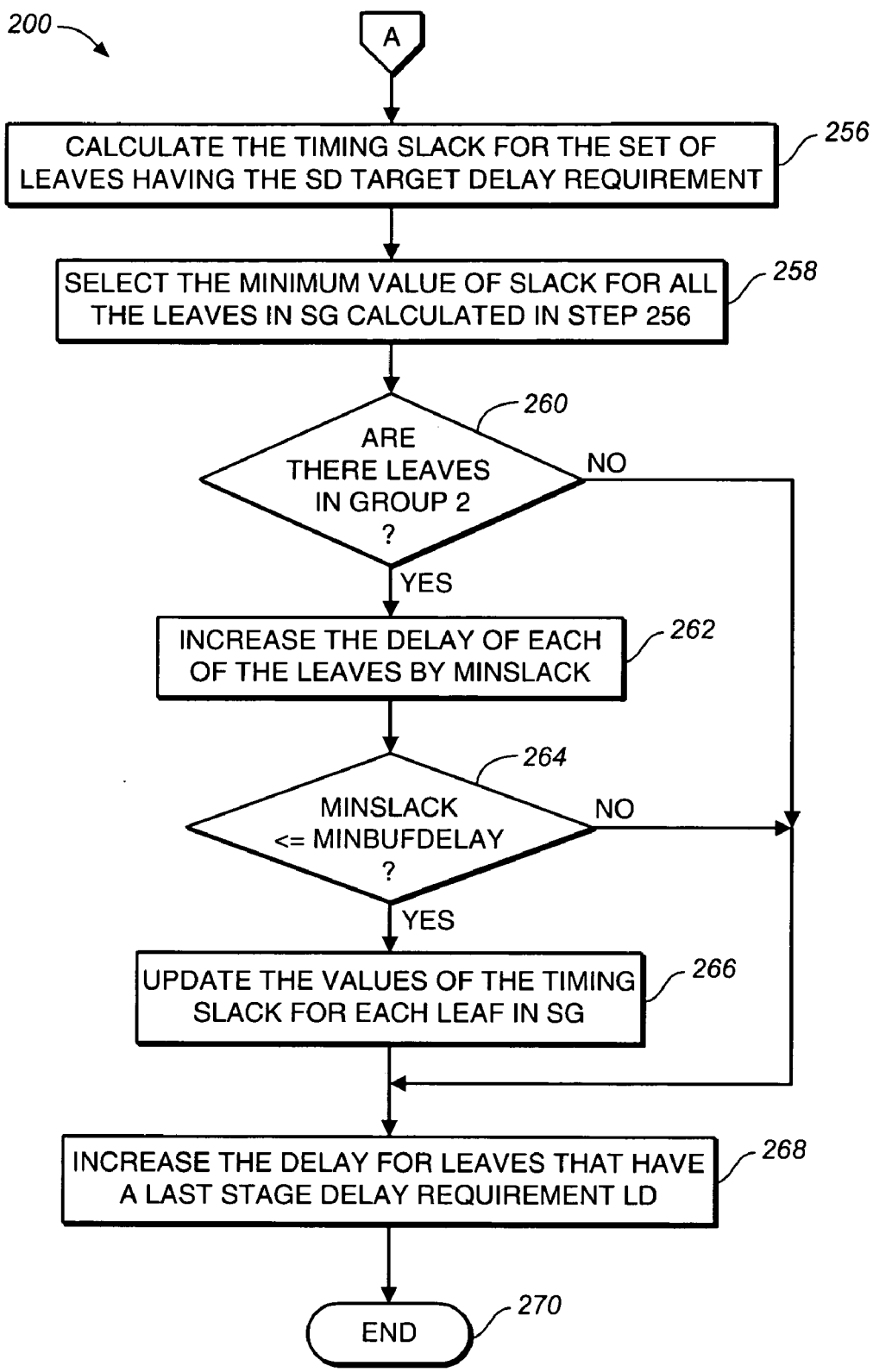
FIG._2D

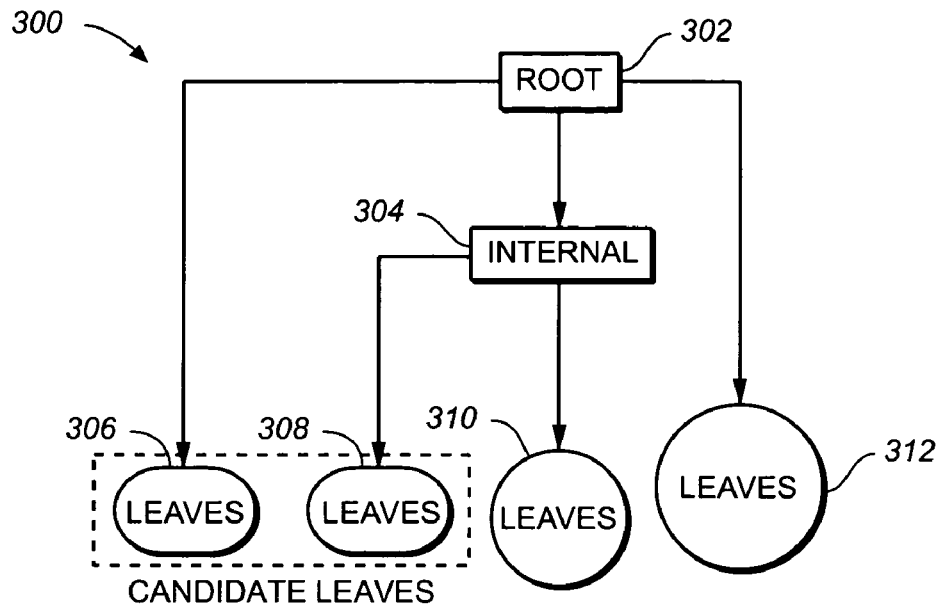
*FIG._3*
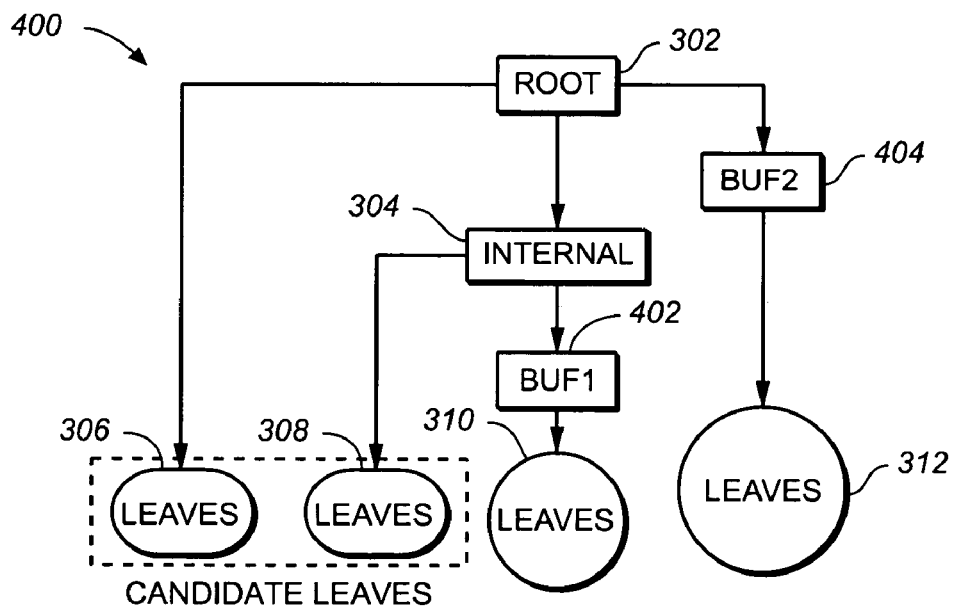
*FIG._4*

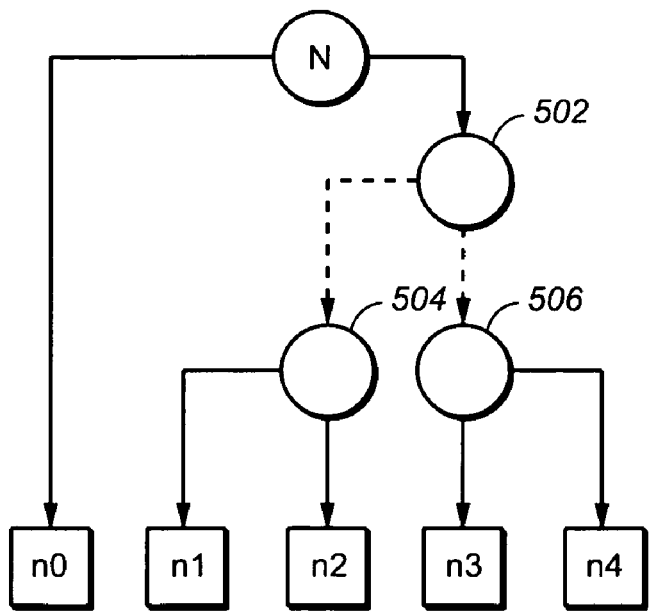
FIG._5
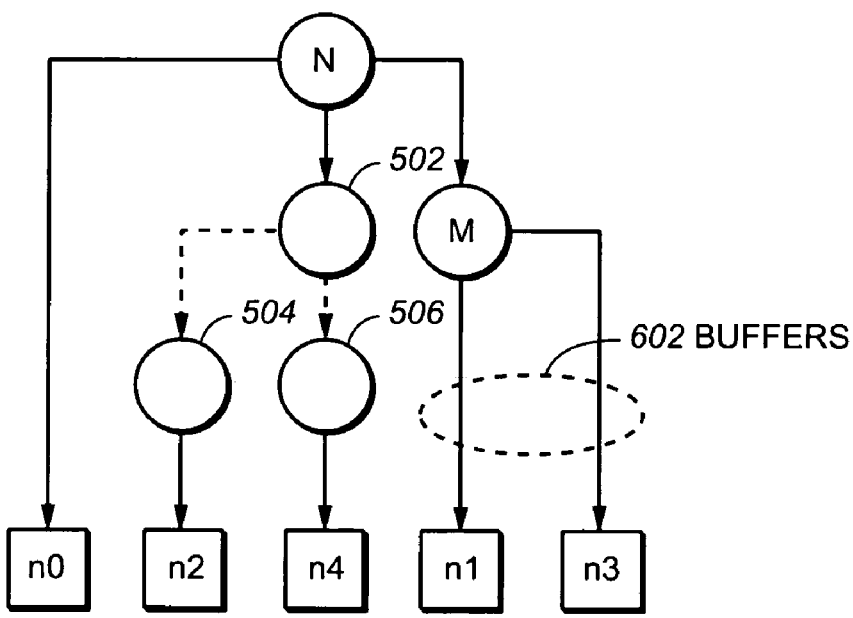
FIG._6

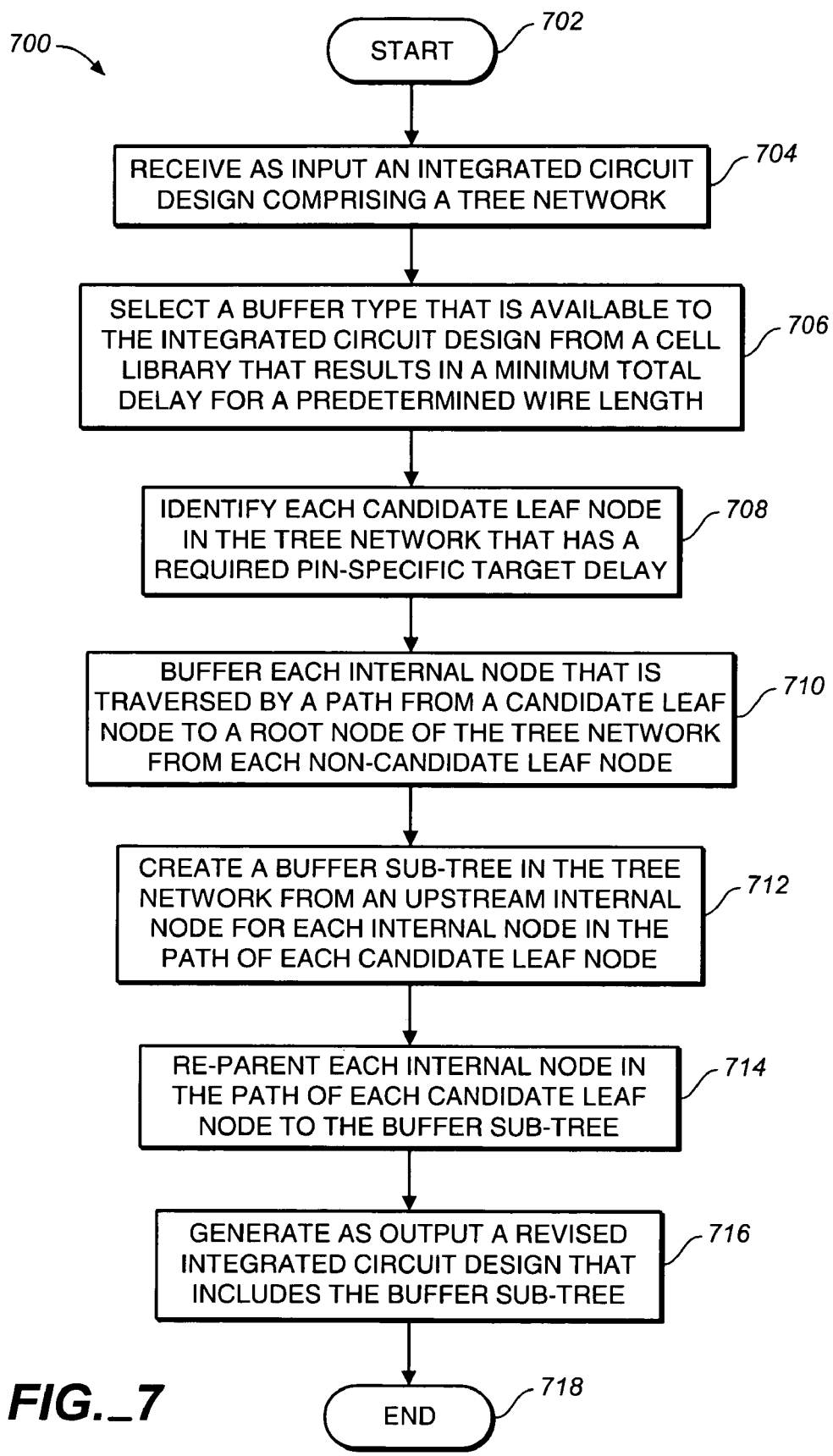
FIG._7

METHOD OF BUFFER INSERTION TO ACHIEVE PIN SPECIFIC DELAYS

BACKGROUND OF THE INVENTION

1. Field of the Invention

The present invention is directed to the design of integrated circuits. More specifically, but without limitation thereto, the present invention is directed to a method of selecting buffer delays for a clock tree in an integrated circuit design.

2. Description of Related Art

As integrated circuit designs incorporate greater numbers of transistors and larger interconnect delays, timing closure becomes an increasingly important step in the design cycle. One of the techniques used to achieve timing closure is the insertion of buffers in tree structures of the integrated circuit design, for example, to improve signal integrity, to reduce interconnect delay, and to split driver loading.

SUMMARY OF THE INVENTION

In one embodiment, a method includes steps of:
(a) receiving as input an integrated circuit design comprising a tree network;
(b) selecting a buffer type available to the integrated circuit design from a cell library that results in a minimum total delay for a predetermined wire length;
(c) identifying each candidate leaf node in the tree network that has a required pin-specific target delay;
(d) inserting a buffer between each internal node that is traversed by a path from a candidate leaf node to a root node of the tree network and each leaf node that is not a candidate leaf node;
(e) creating a buffer sub-tree in the tree network from an upstream internal node for each internal node that is traversed by a path from a candidate leaf node to a root node of the tree network;
(f) re-parenting each internal node that is traversed by a path from a candidate leaf node to a root node of the tree network to a new buffer in the buffer sub-tree; and
(g) generating as output a revised integrated circuit design that includes the buffer sub-tree.

In another embodiment, a computer program product includes a medium for embodying a computer program for input to a computer and a computer program embodied in the medium for causing the computer to perform steps of:
(a) receiving as input an integrated circuit design comprising a tree network;
(b) selecting a buffer type available to the integrated circuit design from a cell library that results in a minimum total delay for a predetermined wire length;
(c) identifying each candidate leaf node in the tree network that has a required pin-specific target delay;
(d) inserting a buffer between each internal node that is traversed by a path from a candidate leaf node to a root node of the tree network and each leaf node that is not a candidate leaf node;
(e) creating a buffer sub-tree in the tree network from an upstream internal node for each internal node that is traversed by a path from a candidate leaf node to a root node of the tree network;
(f) re-parenting each internal node that is traversed by a path from a candidate leaf node to a root node of the tree network to a new buffer in the buffer sub-tree; and
(g) generating as output a revised integrated circuit design that includes the buffer sub-tree.

BRIEF DESCRIPTION OF THE DRAWINGS

The embodiments described herein are illustrated by way of example and not limitation in the accompanying figures, in which like references indicate similar elements throughout the several views of the drawings, and in which:

FIG. 1 illustrates an example of a tree network according to the prior art;

FIGS. 2A, 2B, 2C and 2D are a flow chart for a method of buffer insertion to achieve pin specific delays for the tree network of FIG. 1;

FIG. 3 illustrates a diagram of a tree network for the method of FIG. 2;

FIG. 4 illustrates a diagram of a modified tree network with buffers inserted to separate the candidate leaf nodes from the non-candidate leaf nodes;

FIGS. 5 and 6 illustrate the re-parenting step modifying the tree network of FIG. 4; and FIG. 7 illustrates a flow chart for a computer program product for inserting buffers to achieve pin specific delays.

Elements in the figures are illustrated for simplicity and clarity and have not necessarily been drawn to scale. For example, the dimensions of some elements in the figures may be exaggerated relative to other elements to point out distinctive features in the illustrated embodiments.

DESCRIPTION OF THE ILLUSTRATED EMBODIMENTS

An integrated circuit typically includes a tree network, for example, a clock tree, for transmitting a common signal to multiple locations on an integrated circuit die. The tree network includes a root or root node, internal nodes, and leaf nodes at the ends of the tree network.

FIG. 1 illustrates an example of a tree network 100 according to the prior art. Shown in FIG. 1 are a root node 102, internal nodes 104, and leaf nodes 106.

The tree network 100 starts at the root node 102 and branches out through the internal nodes 104 to the leaf nodes 106. The delay at the root node 102 is defined as zero delay. The delay at each leaf node is the sum of the stage delays from the root node 102 and the internal nodes 104 traversed by the path to the leaf node 106. Each of the internal nodes 104 represents a stage delay, that is, a cell or logic gate delay plus the interconnect delay.

Each of the leaf nodes 106, or leaves, has a pin-specific target delay requirement. A pin-specific target delay requirement means that a pin, which is a leaf node driven by the tree root, has a pre-determined delay that is required to meet timing closure. The majority of the leaves have the same target delay requirement RD, for example, a specific value of delay, or a median value of the delay of all the leaves in a timing group. Some leaves in the tree network 100 have smaller target delay requirements than RD. The smaller target delay requirements are denoted as SD. Some leaves in the tree network 100 have larger-target delay requirements than RD. The larger target delay requirements are denoted as LD.

The specific target delay requirement for each pin defined at the leaf nodes 106 is achieved by inserting a buffer network into the tree network 100. The appropriate selection of buffers and insertion points provides signal integrity, reduces interconnect delay, and relieves gate driver loading.

A method for modifying and refining the buffer network 100 of FIG. 1 to achieve pin specific delays at the leaf nodes is described as follows.

In one embodiment, a method of buffer insertion for a tree network in an integrated circuit design includes steps of:
(a) receiving as input an integrated circuit design comprising a tree network;
(b) selecting a buffer type available to the integrated circuit design from a cell library that results in a minimum total delay for a predetermined wire length;
(c) identifying each candidate leaf node in the tree network that has a required pin-specific target delay;
(d) inserting a buffer between each internal node that is traversed by a path from a candidate leaf node to a root node of the tree network and each leaf node that is not a candidate leaf node;
(e) creating a buffer sub-tree in the tree network from an upstream internal node for each internal node that is traversed by a path from a candidate leaf node to a root node of the tree network;
(f) re-parenting each internal node that is traversed by a path from a candidate leaf node to a root node of the tree network to a new buffer in the buffer sub-tree; and
(g) generating as output a revised integrated circuit design that includes the buffer sub-tree.

FIGS. 2A, 2B, 2C and 2D are a flow chart 200 for a method of buffer insertion to achieve pin specific delays for the tree network 100 of FIG. 1.

Step 202 is the entry point of the flow chart 200.

In step 204, an integrated circuit design that includes a tree network is received as input.

In step 206, a predetermined wire length L, for example, 50 millimeters, that may be driven by each buffer type available to the integrated circuit design from a given cell library is calculated according to the formula $$l\_i = \frac{(MaxCap\_i - PinCap\_i)}{UnitCapacitance} \quad (1)$$

where:
l_i is the maximum wire length that may be driven by a buffer type B_i, where i is an integer from 0 to the total number N−1 of buffer types available from the cell library;
MaxCap_i is the maximum capacitance that the buffer type B_i can drive;
PinCap_i is the input pin capacitance of the buffer type B_i; and
UnitCapacitance is a known technology parameter specific to each cell library technology.

In step 208, the total delay for each buffer type $B_i$ is calculated, for example, by the formula $$D\_i = num\_i \cdot SD\_i + LD\_i \quad (2)$$

where:
D_i is the total delay when buffer type B_i is selected to drive a wire having a length L;
num_i is the number of stages in a path having a total wire length L, that is, num_i=integer(L/l_i);
SD_i is equal to each stage delay when the buffer type B_i drives a load equal to MaxCap_i; and
LD_i is equal to the last stage delay when the buffer type B_i drives a load equal to $$(L - num\_i \cdot l\_i) \cdot UnitCapacitance + Pincap\_i \quad (3)$$

In step 210, the buffer type B_i is selected from the cell library that results in the minimum value of the total delay D_i calculated in step 208, where:
BestBuf is defined as the buffer type B_i for the minimum total delay D_i;
StageDelay is defined as the corresponding stage delay SD_i;
SL is defined as the maximum wire length l_i that may be driven by the buffer type BestBuf;
MaxCap is the maximum capacitance MaxCap_i that the buffer type BestBuf can drive; and
PinCap is the input pin capacitance PinCap_i of the buffer type BestBuf.

In step 212, candidate leaf nodes in the tree network are identified that have a required target delay, for example, smaller than (RD−2*StageDelay). By way of example, a flag may be associated with each internal node and leaf node according to well known computer programming techniques to indicate whether the node is in the path of a candidate leaf node.

FIG. 3 illustrates a diagram of a tree network 300 for an integrated circuit design for the method of FIG. 2. Shown in FIG. 3 are a root node 302, an internal node 304, candidate leaf nodes 306 and 308, and non-candidate leaf nodes 310 and 312.

In FIG. 3, the candidate leaf nodes 306 and 308 have been identified that require the minimum delay. The internal node 304 is also identified as being included in the path of the candidate leaf node 308. The non-candidate leaf nodes 310 and 312 are identified as the remaining leaf nodes that do not require the minimum delay. Internal nodes that are not included in the path of a candidate leaf node are identified, for example, by the flag described above.

In step 214, each of the internal nodes that is traversed by the path from a candidate leaf node to the root node 302 of the tree network 300 is separated from the paths of the non-candidate leaf nodes by inserting buffers between the internal nodes and the non-candidate leaf nodes as illustrated in FIG. 4. The main purpose of this step and the preceding step is to implement the leaves whose target delays are less than (RD−2*StageDelay) according to the definition of the SD delay requirement with the minimum delay. The method used to achieve the minimum delay is to separate the leaves having an SD delay requirement from the other leaves.

FIG. 4 illustrates a diagram of a modified tree network 400 with buffers inserted to separate the candidate leaf nodes from the non-candidate leaf nodes. Shown in FIG. 4 are a root node 302, an internal node 304, candidate leaf nodes 306 and 308, non-candidate leaf nodes 310 and 312, and buffers 402 and 404.

In FIG. 4, the buffers 402 and 404 are inserted between the paths of the candidate leaf nodes 306 and 308 and the non-candidate leaves 402 and 408. The buffer type for the buffers 402 and 404 may be, for example, the buffer type BestBuf. This step reduces the loading and the corresponding stage delays of the nodes in the paths of the candidate leaf nodes 306 and 308.

In step 216, ramptime violations from nets in the paths of the candidate leaf nodes 306 and 308 are corrected as follows. Ramptime violations occur when a buffer drives a load capacitance that is greater than the maximum allowed for the buffer type. For each low fanout net, for example, nets having less than 200 fanouts, the ramptime violations are corrected according to well known buffer insertion techniques, for example, as described by Zolotykh et al., U.S. Pat. No. 6,564,361, incorporated herein by reference.

In step 218, ramptime violations in high fanout nets, that is, nets having more than a maximum number of fanouts determined by the cell technology, for example, 200 fanouts, are corrected to avoid potential routing congestion. The ramptime violations in the high fanout nets may be corrected, for example, by the cluster based approach described by Lu et al., U.S. Pat. No. 6,487,697 B1, incorporated herein by reference. The buffers used in this step are preferably the type BestBuf having the minimum delay as described above.

In step 220, for each high fanout net in the path of a candidate leaf node, the maximum allowable load is defined for a buffer at a buffer level i of the high fanout net in which (i−1) levels of buffers have been inserted, for example, by the formula $$\text{MAX}((\text{MaxCap}-(i-1)\cdot\text{PinCap}), (0.5\cdot\text{MaxCap})) \quad (4)$$

The general idea of formula (4) is to ensure that the buffers close to the root node will have a small load and a correspondingly small stage delay. This is because the buffers close to the root node affect the path delay of a larger number of leaves more than the buffers close to the leaves. On the other hand, the buffer levels that are close to the leaves can drive more fanouts, which reduces the number of buffers that have to be inserted in the path to the leaves. Also, this allowable load control ensures that buffers close to the root node can drive more buffers when necessary in the following re-parenting step without causing ramptime violations.

In step 222, the nets in the path of a candidate leaf node are ordered so that the fanouts of the high fanout net currently being buffered are only leaves or internal nodes whose fanouts have already been buffered. As a result, the order of the nets starts from the driver of a candidate leaf node and ends at the root node. This ordering makes available the downstream delay information for the buffered tree network.

In step 224, each of the internal nodes having a required delay D_req that satisfies the inequality $$D\_req > 2 \cdot \text{StageDelay} \quad (5)$$

is recorded in a list of re-parenting nodes, where D_req is the maximum allowed delay to all downstream leaves from the internal node.

In step 226, a buffer sub-tree is generated as follows for each of the internal nodes recorded in the list of re-parenting nodes so that the internal nodes of the buffer tree are only buffers and/or inverters. Each internal node n_j recorded in the list of re-parenting nodes is traced back from the internal node n_j toward the root node until another internal node n_i is found upstream that satisfies the inequality $$D\_req\_j + d < D\_ij \quad (6)$$

where:
D_req_j is the maximum allowable delay from the internal node n_j to the leaves;
D_ij is the current delay from the internal node n_i to the internal node n_j;
d is the delay required to buffer the wire from the internal node n_i to the internal node n_j defined by the equation $$d = \text{StageDelay} \cdot \left( \frac{L\_ij}{SL + \sqrt{(\text{count}+1)\cdot \text{PinCap}/\text{MaxCap}}} \right) \quad (7)$$

where:
L_ij is the length of the wire from the internal node n_i to the internal node n_j; and
count is the number of recorded re-parenting nodes that will be buffered from the new parent node, that is, the internal node n_i.

In step 228, the internal node n_i is listed as the new parent node of the internal node n_j, and count is incremented by one. If there are inverters from the internal node n_i to the internal node n_j, then the number of inverters must be an even number to maintain the correct logical value of the signal at the internal node n_j.

In step 230, for each internal node N having a non-zero count, a new node M, that is, a buffer, is inserted inside the bounding box of the internal node driven by the internal node n_i so that the buffer node M drives all the recorded re-parenting nodes buffered from the new parent node, that is, the internal node n_i.

FIGS. 5 and 6 illustrate the re-parenting step modifying the tree network of FIG. 4. Shown in FIG. 5 are nodes n0, n1, n2, n3 and n4, driving buffer node N, and buffer nodes 502, 504 and 506. Shown in FIG. 6 are nodes n0, n1, n2, n3 and n4, driving buffer node N, buffer nodes 502, 504 and 506, a new parent buffer node M, and optional buffers 602.

In FIG. 5, the recorded re-parenting nodes n1 and n3 are traced back to the driving buffer node N. In FIG. 6, the new parent buffer node M is inserted inside the bounding box of the net driven by the buffer node N and is connected to the driving buffer node N. The re-parenting of the recorded re-parenting nodes n1 and n3 is the re-routing of the recorded re-parenting nodes n1 and n3 to the new parent buffer node M. Because the new parent buffer node M is inserted inside the bounding box of the net driven by the buffer node N, the load increase for the driving buffer node N is minimized, thereby minimizing the increase in the new stage delay of the parent node N. The maximum allowable load for the driving buffer node N defined in equation (4) ensures that the driving buffer node N is capable to drive the new net including the additional fanout of the new parent buffer node M.

In step 232, the optional buffers 602 shown in FIG. 6 may be inserted in the net driven by the new parent buffer node M according to well known techniques to correct any ramptime violations.

The stage delay requirements for the nodes identified in step 224 have now been implemented with minimum delay. The internal nodes with large downstream delays have been re-parented to reduce the downstream delays. In the following steps, the modified tree network is refined to meet the overall delay requirements.

In step 234, if the set of leaves have a delay requirement of RD, then the target delay TD is set equal to RD. If there is no delay requirement of RD, then the target delay TD is set equal to AveDelay, which is the median delay calculated for all the leaf delays in the tree network.

For an internal node driving K leaves, the timing slack at the i_th leaf is calculated from the equation $$\text{slack}\_i = TD - D\_i \quad (8)$$

where D_i is the current delay at the i_th leaf.

In step 236, the minimum delay MinBufDelay is calculated according to well known techniques for the buffer type BestBuf with a load equal to PinCap.

In step 238, a two-part cost function of the i_th leaf, cost_i0 and cost_i1 is calculated as follows:

If slack_$i$>(0.5*MinbufDelay), then cost_$i$0=-MAX(slack_$i$, MinBufDelay);

cost$i$1=-slack_$i$;

else if (-0.5*MinBufDelay)≦slack_$i$≦(0.5*MinbufDelay), then cost_$i$0=-0.5*MinBufDelay, cost$i$1=0.5*MinBufDelay, else if slack_$i$<(0.5*MinbufDelay), then cost_$i$0=-slack_$i$;

$$\text{cost}i1=-\text{MAX}(\text{slack}\_i, \text{MinBufDelay}) \tag{9}$$

In the conditional equations (9), the delay reduction is guided by cost_i0. If cost_i0 is positive, the delay to the i_th leaf should be reduced. The maximum value of the allowed delay reduction is determined by cost_i1, which guides the delay increase. If cost_i1 is negative, the delay to the i_th leaf should be increased. The maximum value of the allowed delay increase is determined by –cost_i0. If cost_i0≧0 and cost_i1≦0, then no buffers may be inserted for the i_th leaf. If cost_i0<0 and cost_i1>0, then the delay to the i_th leaf may be reduced by the value of cost_i1 or increased by the value of –cost_i0.

In step 240, buffers are inserted in the modified tree network to achieve the required target delays as follows. For the example of K leaves, the leaves are divided into three groups based on the cost function (9):

TABLE 1

| GROUP | cost_i0 | cost_i1 | LEAVES |
|---|---|---|---|
| 1 | >0 | >0 | K1 |
| 2 | ≦0 | ≧0 | K2 |
| 3 | <0 | <0 | K3 |

In step 242, the leaves in group 2 and group 3 are sorted by the value of cost_i0.

In step 244, if cost_i0<0 and the delay increase that may be achieved by buffer insertion is d_i for the i_th leaf, then the gain g_i is defined by $$g\_i=\text{MIN}(d\_i,-\text{cost}\_i1) \tag{10}$$

If d_i>-cost_i0, then a buffer insertion is not accepted. If cost_j0>0 and the delay reduction that may be achieved by buffer insertion is d_j for the j_th leaf, the gain g_j is defined by $$g\_j=\text{MIN}(d\_j,-\text{cost}\_j0) \tag{11}$$

If d_j>cost_j1, then a buffer insertion is not accepted. If a buffer insertion is accepted, then a buffer is inserted in a proposed first iteration that drives all leaves of group 3, and the total gain on all leaves is calculated according to the equation $$g=\Sigma g\_i, i=0,1,2,\ldots,k \text{ and } g\_i>0 \tag{12}$$

In step 246, two buffers are inserted in a proposed second iteration that drive an equal number of leaves in group 3. If K3 is an odd number, one of the inserted buffers drives K3/2 leaves that have a large cost_i0 and the other inserted buffer drives one or more leaves that have a smaller cost_i0 based on the sorting in step 238. If a buffer insertion is accepted for the second iteration, then the total gain g is calculated again from equation (12). Additional proposed iterations are performed in the same manner until the number of iterations equals K3. In this iteration, K3 buffers are inserted, each of which drives a single leaf node in group 3. If the buffer insertion is accepted, the total gain g is calculated again from equation (12).

In step 248, if a buffer insertion is accepted, then the flow chart 200 continues from step 250, otherwise from step 252.

In step 250, the proposed iteration having the maximum cost function gain of g calculated above is used to perform the buffer insertion, and the flow chart 200 continues from step 256.

In step 252, if there are leaves in group 2, then the flow chart 200 continues from step 254, otherwise from step 256.

In step 254, group 2 is merged with group 3, and K2+K3 proposed iterations are attempted in the same manner as described above for group 3. While buffering leaves in group 2 does not provide any gain for those leaves, the different combination of load splitting usually opens more chances for finding a successful buffer insertion.

In step 256, the set of leaves that were implemented with the minimum delay in steps 212 and 214 having the SD target delay requirement, that is, a delay requirement less than RD, are represented by SG. The delays of the leaves in SG have to be increased to meet the overall delay requirement. For each leaf in SG, the timing slack is calculated from the equation $$\text{slack}\_i=TD\_i-D\_i \tag{13}$$

where TD_i is the target delay requirement for the i_th leaf, and D_i is the current delay for the i_th leaf. Unlike the target delay TD in step 234, each leaf in SG may have a different target delay. The SD target delay requirement may have either a specific value, for example, 1 nanosecond for the i_th leaf, or the SD target delay requirement may have a relative value, for example, the delay of the i_th leaf may be required to be less than RD by Diff_i. In this case, the timing slack is calculated from the equation $$\text{slack}\_i=\text{AveDelay}-\text{Diff}\_i-D\_i, i \in SG \tag{14}$$

Because AveDelay is known only after the tree network has been buffered, that is, after all ramptime violations of the tree network have been fixed, the relative delay format provides the user with flexibility in adjusting leaf delays.

In step 258, the minimum value of slack_i for all the leaves in SG calculated in step 256 is selected and is represented by the variable MinSlack.

In step 260, if MinSlack>MinBufDelay, then the flow chart 200 continues from step 262, otherwise from step 264.

In step 262, the delay of each of the leaves in SG is increased by MinSlack, for example, by inserting a buffer chain at the internal node driving SG, and the flow chart 200 continues from step 268.

In step 264, if MinSlack≦MinBufDelay, then the flow chart 200 continues from step 266, otherwise from step 268.

In step 266, the values of the timing slack slack_i are updated for each leaf in the set SG, and the individual delay requirements are achieved, for example, using the cost function buffer insertion algorithm described above.

In step 268, the delay for leaves that have the LD delay requirement may be increased, for example, using the SD target requirement algorithm described above.

Step 270 is the exit point of the flow chart 200.

Although the flowchart descriptions above are described and shown with reference to specific steps performed in a specific order, these steps may be combined, sub-divided, or reordered without departing from the scope of the claims. Unless otherwise indicated, the order and grouping of steps is not a limitation of other embodiments that may lie within the scope of the claims.

The flow chart described above may also be implemented by instructions for being performed on a computer. The instructions may be embodied in a disk, a CD-ROM, and other computer readable media according to well known computer programming techniques.

In another embodiment, a computer program product includes a medium for embodying a computer program for input to a computer and a computer program embodied in the medium for causing the computer to perform steps of:

(a) receiving as input an integrated circuit design comprising a tree network;
(b) selecting a buffer type available to the integrated circuit design from a cell library that results in a minimum total delay for a predetermined wire length;
(c) identifying each candidate leaf node in the tree network that has a required pin-specific target delay;
(d) inserting a buffer between each internal node that is traversed by a path from a candidate leaf node to a root node of the tree network and each leaf node that is not a candidate leaf node;
(e) creating a buffer sub-tree in the tree network from an upstream internal node for each internal node that is traversed by a path from a candidate leaf node to a root node of the tree network;
(f) re-parenting each internal node that is traversed by a path from a candidate leaf node to a root node of the tree network to a new buffer in the buffer sub-tree; and
(g) generating as output a revised integrated circuit design that includes the buffer sub-tree.

FIG. 7 illustrates a flow chart 700 for a computer program product for inserting buffers to achieve pin specific delays.

Step 702 is the entry point of the flow chart 700.

In step 704, an integrated circuit design comprising a tree network is received as input.

In step 706, a buffer type is selected that is available to the integrated circuit design from a cell library that results in a minimum total delay for a predetermined wire length.

In step 708, each candidate leaf node in the tree network is identified that has a required pin-specific target delay.

In step 710, each internal node that is traversed by a path from a candidate leaf node to a root node of the tree network is buffered from each non-candidate leaf node.

In step 712, a buffer sub-tree is created in the tree network from an upstream internal node for each internal node that is traversed by a path from a candidate leaf node to a root node of the tree network.

In step 714, each internal node that is traversed by a path from a candidate leaf node to a root node of the tree network is re-parented to a new buffer in the buffer sub-tree.

In step 716, a revised integrated circuit design is generated as output that includes the buffer sub-tree.

Step 718 is the exit point of the flow chart 700.

The specific embodiments and applications thereof described above are for illustrative purposes only and do not preclude modifications and variations that may be made thereto by those skilled in the art within the scope of the following claims.

What is claimed is:

1. A method comprising steps of:
(a) receiving as input an integrated circuit design comprising a tree network;
(b) selecting a buffer type available to the integrated circuit design from a cell library that results in a minimum total delay for a predetermined wire length;
(c) identifying a candidate leaf node in the tree network, the candidate leaf node having a required pin-specific target delay that is less than a selected minimum delay;
(d) inserting a buffer between a first node that is traversed by a path from the candidate leaf node to a root node of the tree network and each leaf node that is not a candidate leaf node;
(e) creating a buffer sub-tree in the tree network from a second node upstream from the first node;
(f) separating the buffer from the first node and reconnecting the buffer to a buffer in the buffer sub-tree; and
(g) generating as output a revised integrated circuit design that includes the buffer sub-tree.

2. The method of claim 1 wherein step (b) comprises:
(b1) calculating a maximum wire length that may be driven by each buffer type available to the integrated circuit design from a cell library; and
(b2) calculating a total delay for each buffer type driving a maximum capacitive load.

3. The method of claim 1 wherein step (d) comprises inserting at least one buffer between the first node and another node in the path of both a candidate leaf node and a non-candidate leaf node.

4. The method of claim 1 wherein step (e) comprises inserting a buffer between the second node and a node driven by the second node to minimize increase in stage delay of the buffer sub-tree.

5. The method of claim 4 wherein step (e) comprises inserting an additional buffer in the buffer sub-tree to correct a ramptime violation.

6. The method of claim 1 further comprising a step of refining the tree network including the buffer sub-tree to meet an overall delay requirement.

7. The method of claim 6 wherein refining the tree network comprises calculating a cost function for a leaf node, the cost function having a first part that determines a maximum value of allowable delay increase and a second part that determines a maximum value of allowable delay reduction in a total delay of the leaf node.

8. The method of claim 7 wherein the cost function is a function of timing slack in the total delay of the leaf node and a minimum buffer delay.

9. The method of claim 8 further comprising a step of inserting a number of buffers in the tree network to produce a maximum value of the cost function.

10. A computer readable storage medium tangibly embodying instructions for a computer that when executed by the computer implement a method comprising steps of:
(a) receiving as input an integrated circuit design comprising a tree network;
(b) selecting a buffer type available to the integrated circuit design from a cell library that results in a minimum total delay for a predetermined wire length;
(c) identifying a candidate leaf node in the tree network, the candidate leaf node having a required pin-specific target delay that is less than a selected minimum delay;
(d) inserting a buffer between a first node that is traversed by a path from the candidate leaf node to a root node of the tree network and each leaf node that is not a candidate leaf node;
(e) creating a buffer sub-tree in the tree network from a second node upstream from the first node;
(f) separating the buffer from the first node and reconnecting the buffer to a buffer in the buffer sub-tree; and (g) generating as output a revised integrated circuit design that includes the buffer sub-tree.

11. The computer readable storage medium of claim 10 wherein step (b) comprises:
- (b1) calculating a maximum wire length that may be driven by each buffer type available to the integrated circuit design from a cell library; and
- (b2) calculating a total delay for each buffer type driving a maximum capacitive load.

12. The computer readable storage medium of claim 10 wherein step (d) comprises inserting at least one buffer between the first node and another node in the path of both a candidate leaf node and a non-candidate leaf node.

13. The computer readable storage medium of claim 10 wherein step (e) comprises inserting a buffer between the second node and a node driven by the second node to minimize increase in stage delay of the buffer sub-tree.

14. The computer readable storage medium of claim 13 wherein step (e) comprises inserting an additional buffer in the buffer sub-tree to correct a ramptime violation.

15. The computer readable storage medium of claim 10 further comprising a step of refining the tree network including the buffer sub-tree to meet an overall delay requirement.

16. The computer readable storage medium of claim 15 wherein refining the tree network comprises calculating a cost function for a leaf node, the cost function having a first part that determines a maximum value of allowable delay increase and a second part that determines a maximum value of allowable delay reduction in a total delay of the leaf node.

17. The computer readable storage medium of claim 16 wherein the cost function is a function of timing slack in the total delay of the leaf node and a minimum buffer delay.

18. The computer readable storage medium of claim 17 further comprising a step of inserting a number of buffers in the tree network to produce a maximum value of the cost function.

* * * * *